United States Patent
Han et al.

(10) Patent No.: US 7,579,263 B2
(45) Date of Patent: Aug. 25, 2009

(54) THREADING-DISLOCATION-FREE NANOHETEROEPITAXY OF GE ON SI USING SELF-DIRECTED TOUCH-DOWN OF GE THROUGH A THIN SIO$_2$ LAYER

(75) Inventors: Sang Han, Albuquerque, NM (US); Qiming Li, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 74 days.

(21) Appl. No.: 10/935,228

(22) Filed: Sep. 8, 2004

(65) Prior Publication Data

US 2005/0054180 A1 Mar. 10, 2005

Related U.S. Application Data

(60) Provisional application No. 60/501,274, filed on Sep. 9, 2003.

(51) Int. Cl.
*H01L 21/20* (2006.01)
*C30B 25/02* (2006.01)

(52) U.S. Cl. ......................... 438/481; 117/88

(58) Field of Classification Search ............. 117/87–88, 117/94–95, 97; 438/478–479, 481, 503, 438/507, 962
See application file for complete search history.

(56) References Cited

U.S. PATENT DOCUMENTS

| | | | | |
|---|---|---|---|---|
| 6,576,532 | B1* | 6/2003 | Jones et al. | 438/481 |
| 7,033,936 | B1* | 4/2006 | Green | 438/669 |
| 2001/0053618 | A1* | 12/2001 | Kozaki et al. | 438/933 |
| 2002/0052061 | A1* | 5/2002 | Fitzgerald | 438/46 |
| 2002/0098671 | A1* | 7/2002 | Cheong | 438/592 |
| 2003/0092230 | A1* | 5/2003 | Koike et al. | 438/200 |
| 2003/0102469 | A1* | 6/2003 | Jones et al. | 257/9 |
| 2003/0168002 | A1* | 9/2003 | Zaidi | 117/101 |
| 2004/0121507 | A1* | 6/2004 | Bude et al. | 438/93 |
| 2004/0266145 | A1* | 12/2004 | Morse | 438/481 |

(Continued)

FOREIGN PATENT DOCUMENTS

WO WO 0148799 A1 * 7/2001

(Continued)

OTHER PUBLICATIONS

Alexander A. Ahklyaev and Masakazu Ichikawa. "Effect of Interfaces of Quantum Confinement in Ge Dots Grown On Si Surfaces With a SiO2 Coverage." Surface Science 514 (2002) 19-26.*

(Continued)

*Primary Examiner*—Douglas M Menz
*Assistant Examiner*—Matthew W Such
(74) *Attorney, Agent, or Firm*—MH2 Technology Law Group LLP

(57) ABSTRACT

A method of forming a virtually defect free lattice mismatched nanoheteroepitaxial layer is disclosed. The method includes forming an interface layer on a portion of a substrate. A plurality of seed pads are then formed by self-directed touchdown by exposing the interface layer to a material comprising a semiconductor material. The plurality of seed pads, having an average width of about 1 nm to 10 nm, are interspersed within the interface layer and contact the substrate. An epitaxial layer is then formed by lateral growth of the seed pads over the interface layer.

7 Claims, 4 Drawing Sheets

U.S. PATENT DOCUMENTS

2005/0136566 A1* 6/2005 Morse .................. 438/63
2005/0136626 A1* 6/2005 Morse .................. 438/481
2006/0073681 A1* 4/2006 Han .................... 438/479

FOREIGN PATENT DOCUMENTS

WO    WO 02/090625 A1 * 11/2002
WO    WO 0290625 A1 * 11/2002

OTHER PUBLICATIONS

Serge Luryi and Ephram Suhir. "New Approach to the High Quality Epitaxial Growth of Lattice-Mismatched Materials." Applied Physics Letters 49 (1986) 140-142.*

Eun Soo Kim, Noritaka Usami and Yasuhiro Shiraki. "Selective Epitaxial Growth of Dot Structures On Patterned Si Substrates By Gas Source Molecular Beam Epitaxy." Semiconductor Science Technology 14 (1999) 257-265.*

Takeshi Kitajima, Bing Liu and Stephen R. Leone. "Two-Dimensional Periodic Alignment of Self-Assembled Ge Islands On Patterned Si(001) Surfaces." Applied Physics Letters 80 (2002) 497-499.*

T.A. Langdo, C.W. Leitz, M.T. Currie, E.A. Fitzgerald, A. Lochtefeld and D.A. Antoniades. "High Quality Ge On Si By Epitaxial Necking." Applied Physics Letters 76 (2000) 3700-3702.*

L. Vescan, C Dieker, A Hartmann and A van der Hart. "Si/Si1-xGex Dots Grown By Selective Epitaxy." Semiconductor Science Technology 9 (1994) 387-391.*

Qiming Li, Sang M. Han, Steven R.J. Brueck, Stephan Hersee, Ying-Bing Jiang and Huifang Xu. "Selective Growth of Ge On Si(100) Through Vias of SiO2 Nanotemplate Using Solid Source Molecular Beam Epitaxy." Applied Physics Letters 83 (2003) 5032-5034.*

Qiming Li, Ying-Bing Jiang, Huifang Xu, Stephan Hersee and Sang M. Han. "Heteroepitaxy of High-Quality Ge On Si By Nanoscale Ge Seeds Grown Through a Thin Layer of SiO2." Applied Physics Letters 85 (2004) 1928-1930.*

Alexander A. Shklyaev and Masakazu Ichikawa. "Effect of Interfaces of Quantum Confinement in Ge Dots Grown On Si Surfaces With a SiO2 Coverage." Surface Science 514 (2002) 19-26.*

Qiming Li, Ying-Bang Jiang, Huifang Xu, Stephen Hersee and Sang M. Han. "Heteroepitaxy of High-Quality Ge on Si by Nanoscale Ge Seeds Grown Through a Thin Layer of SiO2." Applied Physics Letters 85 (2004) 1928-1930.*

Alexander A. Shklyaev, Motoshi Shibata and Masakazu Ichikawa. "High-Density Ultrasmall Epitaxial Ge Islands on Si(111) Surfaces With a SiO2 Coverage." Physical Review B 62 (2000) 1540-1543.*

A. Barski, M. Derivaz, J. L. Rouviere and D Buttard. "Epitaxial Growth of Germanium Dots on Si(001) Surface Covered by a Very Thin Silicon Oxide Layer." Applied Physics Letters 77 (2000) 3541-3543.*

Motoshi Shibata, Yoshiki Nitta, Ken Fujita and Masakazu Ichikawa. "Facets Formation of Pyramidal Si Nanocrystals Selectively Grown On Si(001) Windows In Ultrathin SiO2 Films." Journal of Crystal Growth 220 (2000) 449-456.*

Yakimov, A.I., et al. "Stark Effect In Type-II Ge/Si Quantum Dots." Phys. Rev. B, vol. 67 (Mar. 31, 2003): Article 125318.*

Tong, S., et al. "Normal-Incidence Ge Quantum-Dot Photodetectors at 1.5 μm Based On Si Substrate." Appl. Phys. Lett., vol. 80 (Feb. 18, 2002): pp. 1189-1191.*

Shklyaev, A.A. and Ichikawa, M. "Visible Photoluminescence of Ge Dots Embedded In Si/SiO2 Matrices." Appl. Phys. Lett., vol. 80 (Feb. 25, 2002): pp. 1432-1434.*

Derivaz, M. et al. "Growth of Highly Strained Germanium Dots On Si(001) Covered By A Silicon Nitride Layer." Appl. Phys. Lett., vol. 81 (Nov. 11, 2002): pp. 3843-3845.*

B.V. Kamenev, H. Grebel, L. Tsybeskov, T.I. Kamins, R. Stanley Williams, J.M. Baribeau, D.J. Lockwood, "Polarized Raman scattering and localized embedded strain in self-organized Si/Ge nanostructures," Applied Physics Letters, 83, No. 24, pp. 5035-5037 (Dec. 15, 2003).

R. People, J.C. Bean, "Calculation of critical layer thickness versus lattice mismatch for $Ge_xSi_{1-x}$/Si strained-layer heterostructures," Applied Physics Letters, 47, No. 3, pp. 322-324 (Aug. 1, 1985).

A.A. Shklyaev, M. Shibata, M. Ichikawa, "High-density ultrasmall epitaxial Ge islands on Si(111) surfaces with a $SiO_2$ coverage," Physical Review B, 62, No. 3, pp. 1540-1543 (Jul. 15, 2001).

T. Stoica, L. Vescan, "Optoelectronic properties of thick SiGe layers grown as small mesas by low pressure chemical vapor deposition," Journal of Applied Physics 93, No. 8, pp. 4461-4467 (Apr. 15, 2003).

G. Abstreiter, P. Schittenhelm, C. Engel, E. Silveira, A. Zrenner, D. Meertens, W. Jager, "Growth and characterization of self-assembled Ge-rich islands of Si," Semicond. Sci. Technol., 11 pp. 1521-1528 (1996).

A.O. Orlov, I. Amlani, G. H. Bernstein, C.S. Lent, G.L. Snider, "Realization of a Functional Cell for Quantum-Dot Cellular Automata," Science, vol. 277, pp. 928-930 (Aug. 15, 1997).

F.M. Ross, J. Tersoff, R.M. Tromp, "Coarsening of Self-Assembled Ge Quantum Dots on Si(100)," Physical Review Letters, 80, No. 5, pp. 984-987 (Feb. 2, 1998).

M. Stoffel, U. Denker, O.G. Schmidt, "Electroluminescence of self-assembled Ge hut clusters," Applied Physics Letters, 82, No. 19, pp. 3236-3238 (May 12, 2003).

L. Vescan, T. Stoica, O. Chretien, M. Goryll, E. Mateeva, A. Muck, "Size distribution and electroluminescence of self-assembled Ge dots," Journal of Applied Physics, 87, No. 10, pp. 7275-7282 (May 15, 2000).

* cited by examiner

THREADING-DISLOCATION-FREE NANOHETEROEPITAXY OF GE ON SI USING SELF-DIRECTED TOUCH-DOWN OF GE THROUGH A THIN SIO$_2$ LAYER

CROSS-REFERENCE TO RELATED APPLICATIONS

This application claims priority to U.S. Provisional Patent Application Ser. No. 60/501,274 filed on Sep. 9, 2003, the disclosure of which is incorporated herein by reference.

GOVERNMENT RIGHTS

This invention was made with government support under Award No. DMR-0094145 awarded by the National Science Foundation. The government has certain rights in the invention.

FIELD OF THE INVENTION

The present invention relates to. semiconductor devices and methods for their manufacture and, more particularly, relates to epitaxial growth of lattice mismatched systems.

BACKGROUND OF THE INVENTION

Conventional semiconductor device fabrication is generally based on growth of lattice-matched layers. A lattice mismatched epitaxial layer at a semiconductor interface can lead to a high density of dislocations that degrade semiconductor device performance. Over the past several years, however, there has been increased interest in epitaxial growth of lattice-mismatched semiconducting material systems. Lattice mismatched systems can provide a greater range of materials characteristics than silicon. For example, the mechanical stress in a lattice mismatched layer and control of its crystal symmetry can be used to modify the energy-band structure to optimize performance of optoelectronic devices. Lattice mismatched systems can also enable compound semiconductor devices to be integrated directly with Si-based complementary metal oxide semiconductor (CMOS) devices. This capability to form multifunction chips will be important to the development of future optical and electronic devices.

Problems arise, however, because an epitaxial layer of a lattice-mismatched material on a substrate is often limited to a critical thickness ($h_c$), before misfit dislocations begin to form in the epitaxial material. For example, $h_c$=2 nm for a germanium epitaxial layer on a silicon substrate. Because of the relatively small $h_c$ and the large dislocation densities at thicknesses greater than $h_c$, use of the heteroepitaxial layer is impractical.

Thus, there is a need to overcome these and other problems of the prior art and to provide a method to grow defect free heteroepitaxial layers of lattice mismatched systems.

SUMMARY OF THE INVENTION

According to various embodiments, the present teachings include a method of forming a semiconductor layer including forming an interface layer on a portion of a substrate. The interface layer is exposed to a material comprising a semiconductor material to form a plurality of seed pads interspersed within the interface layer and contacting the substrate. A semiconductor layer is then formed by lateral growth of the seed pads over the interface layer.

According to various embodiments, the present teachings also include a method of forming a semiconductor layer including forming an oxide layer on a portion of a semiconductor substrate. A plurality of seed pads comprising germanium are formed by self-directed touchdown. The plurality of seed pads are interspersed within the oxide layer and contact the semiconductor substrate. A germanium layer is then formed by lateral growth of the seed pads over the oxide layer.

According to various embodiments, the present teachings further include a semiconductor device including a substrate and an oxide layer disposed on a portion of the substrate. The semiconductor device also includes a plurality of seed pads formed by self-directed touchdown. The plurality of seed pads are separated from each other by the oxide layer. The semiconductor device further includes a semiconductor layer disposed over the substrate, wherein the semiconductor layer is formed by lateral growth of the seed pads over the oxide layer.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

As used herein, the term "self-directed touchdown" refers to a nucleation and growth process that is initiated without reliance on a photolithographic mask to pattern a substrate or other layer.

As used herein, the term "nanoheteroepitaxy" refers to engineering a heterojunction at the nanoscale to relieve lattice strain.

FIGS. 1 to 6 depict exemplary semiconductor devices with nanoheteroepitaxial layers and manufacturing methods to form semiconductor devices with nanoheteroepitaxial layers having a lattice mismatched substrate and semiconductor layer in accordance with various embodiments of the invention. The semiconductor devices comprise a plurality of seed pads formed by self-directed touch-down through a portion of an interface layer and on a substrate. A semiconductor layer can then be formed by coalescence of the seed pads over the portions of the interface layer. The semiconductor layers formed by the exemplary methods have a sufficiently low threading-dislocation density, regardless of the critical thickness of the semiconductor layer, so that the deposited semiconductor layer can be effectively used for integrated circuit applications. For ease of illustration, the invention will be described with reference to a manufacturing process for formation of an epitaxial layer of germanium (Ge), having a lattice parameter of about 5.66 Å, on silicon (Si), having a lattice parameter of about 5.44 Å.

Figure 1:
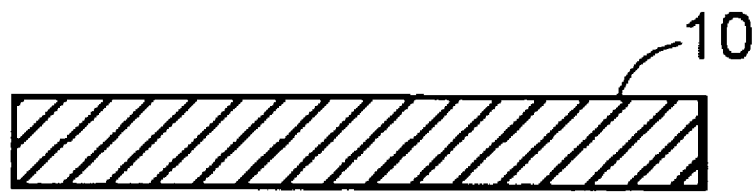
FIG. 1 depicts a cross-section of a substrate in accordance with exemplary embodiments of the invention.

Referring to FIG. 1, a substrate 10 is shown. Substrate 10 can be, for example, a silicon substrate. Other substrate materials can include any semiconductor material having a lattice-mismatch to a desired epitaxial layer. The terms "lattice-mismatch" and "lattice-mismatched material" as used herein refer to any materials whose lattice parameters in a given crystalline plane or direction are not identical. Lattice-mismatched materials can include, but are not limited to, silicon and germanium, silicon and carbon, silicon and GaAs, silicon and InP, and silicon and gallium nitride.

Figure 2:
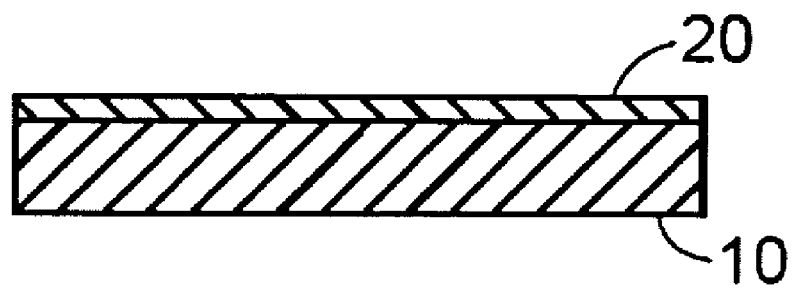
FIG. 2 depicts a cross-sectional view of an interface layer on a substrate in accordance with exemplary embodiments of the invention.

As shown in FIG. 2, an interface layer 20 can be formed on substrate 10. Interface layer 20 can be, for example, an oxide layer, such as, a $SiO_2$ layer, having a thickness of about 1 Å to about 30 Å. The $SiO_2$ layer can be formed by methods known in the art, such as, treating substrate 10 in a Piranha solution or by thermal growth. Other interface materials can include, but are not limited to, silicon nitride, siliconoxynitride, anodized aluminum oxide (AAO), and other oxides. In various embodiments, interface layer 20 can comprise an amorphous material.

In various embodiments, properties of interface layer 20, such as surface roughness and thickness, can be controlled to tailor the defect morphology of the epitaxial layer. For example, interface layer 20 can be formed using $H_2O_2$ to achieve a monolayer of atomically flat $SiO_2$ on a hydrogenated Si(100) substrate.

Figure 3A:
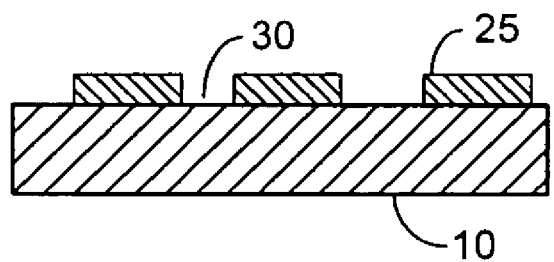
FIG. 3A depicts a cross-sectional view of seed pad sites interspersed in an interface layer in accordance with exemplary embodiments of the invention.
Figure 3B:
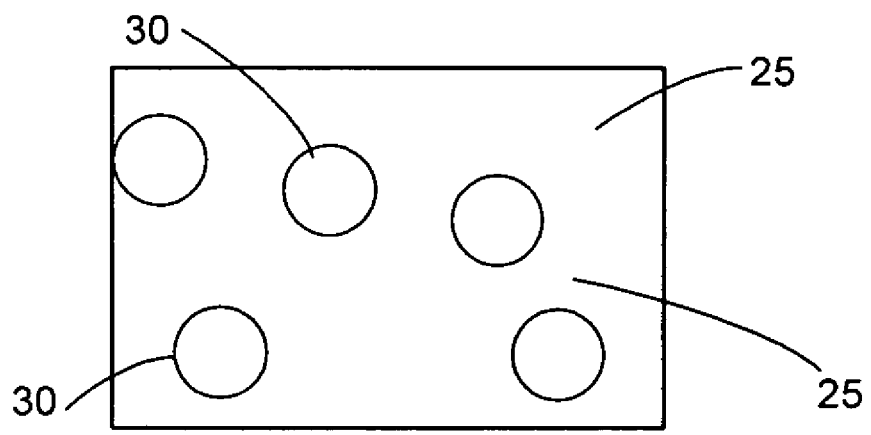
FIG. 3B depicts a top-down view of seed pad sites interspersed in an interface layer in accordance with exemplary embodiments of the invention.
Figure 4A:
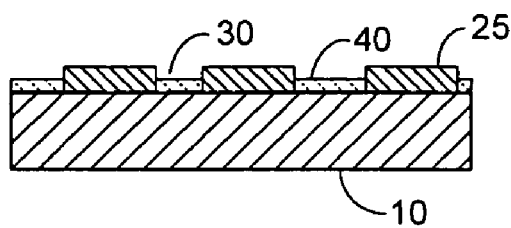
FIG. 4A depicts a cross-sectional view of seed pads on a substrate and separated by portions of the interface layer in accordance with exemplary embodiments of the invention.
Figure 4B:
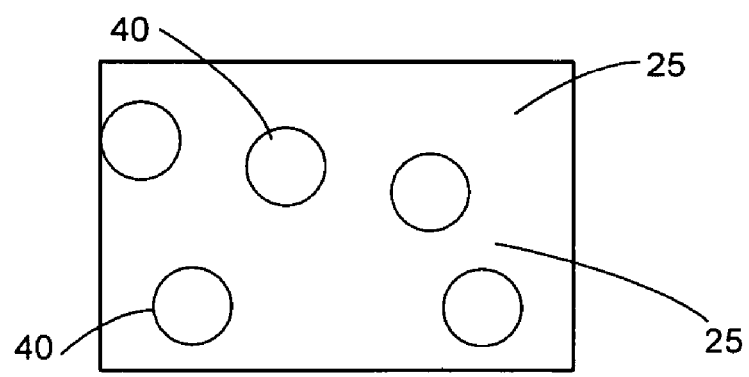
FIG. 4B depicts a top-down view of seed pads on a substrate and separated by portions of the interface layer in accordance with exemplary embodiments of the invention.

After forming interface layer 20 on substrate 10, interface layer 20 can be exposed to a material comprising a semiconductor material. Exposure temperatures can be about 500° C. to about 750° C. The semiconductor material can comprise, for example, Ge. In various embodiments, molecular beam epitaxy can be used to expose interface layer 20 to Ge. As shown in FIGS. 3A and 3B, the Ge can react with interface layer 20, to form interface layer free areas 30, exposing portions of substrate 10. Interface layer free areas 30 can form, for example, through reaction of the Ge with the oxide film as follows: $SiO_2(s)+Ge(ad)\rightarrow SiO(g)+GeO(g)$. Interface layer free areas 30 can be randomly distributed to form a remaining portion of interface layer 25, and can be about 2 nm to about 8 nm wide. The spacing between interface layer free areas can be about 2 nm to about 14 nm.

As exposure to Ge by molecular beam epitaxy continues, Ge can deposit in interface layer free areas 30. There is generally no deposition on remaining portions of interface layer 25, due to selective deposition. This self-directed touchdown of Ge on Si occurs without lithography to pattern the substrate or interface layer. The regions of Ge growth on Si substrate 10 can form crystalline Ge islands, referred to herein as seed pads 40, shown in FIGS. 4A and 4B. Seed pads 40 can then laterally overgrow and coalesce, as exposure to Ge continues. As lateral growth of Ge seed pads 40 over remaining $SiO_2$ oxide layer 25 continues, Ge seed pads 40 coalesce into a single semiconductor layer. The semiconductor layer can be a virtually defect free single crystalline epitaxial lateral overgrowth (ELO) layer.

Figure 5:
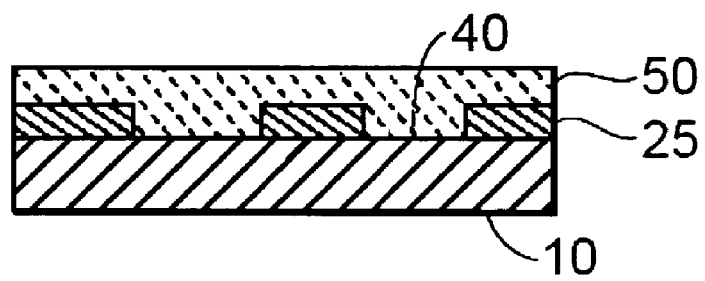
FIG. 5 depicts a cross-sectional view of a semiconductor layer formed by lateral growth of seed pads over portions of the interface layer in accordance with exemplary embodiments of the invention.

FIG. 5 shows a semiconductor layer 50 formed by coalesced seed pads having an atomically abrupt interface with substrate 10. Semiconductor layer 50 can be virtually defect-free having a threading dislocation density of about $1\times10^5$ $cm^{-2}$ or less. Stacking faults can exist over the remaining oxide layer patches 25, but generally terminate within about 80 nm from the $SiO_2$-Ge interface. The thickness of semiconductor layer 50 can be greater than the critical thickness $h_c$, for example, greater than the critical thickness of 2 nm for 100% Ge on Si. Seed pads 40 can have an average width of about 1 nm to 10 nm. The distance between seed pads can be about 3 nm or more.

Figure 6:
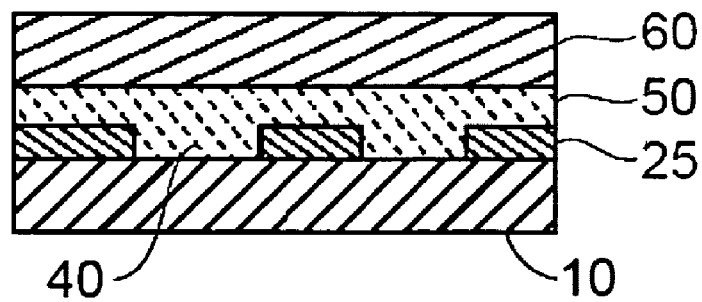
FIG. 6 depicts a cross-sectional view of a second semiconductor layer on the semiconductor layer in accordance with exemplary embodiments of the invention.

In various embodiments, a second semiconductor layer 60 can be deposited over the semiconductor layer. The second semiconductor layer can comprise one or more materials from Group II, Group III, Group IV, Group V, and Group VI, such as, for example, GaN, GaAs, AlGaAs, InGaP, AlInP, AlInGaP, InGaAsN, SiGe. As shown in FIG. 6, second semiconductor layer 60 can be formed on semiconductor layer 50.

A specific example of nanoheteroepitaxy to grow virtually dislocation-free lattice mismatched materials will now be provided. It is to be understood that the disclosed examples are exemplary and in no way are intended to limit the scope of the invention.

EXAMPLE 1

Samples I was undoped Si(100) including an interface layer of $SiO_2$. Sample II was undoped Si(100) stripped of an interface layer by exposure to HF.

Both sample substrates were first treated to remove contaminates by immersion in a Piranha solution for about 5 minutes to form a thin layer of $SiO_2$ on the substrate. The Piranha solution was prepared by mixing 4 volumetric parts of 2M $H_2SO_4$ with 1 volumetric part of 30 wt % $H_2O_2$. The samples were then treated for 5 minutes in an HF solution to remove the $SiO_2$ layer. The HF solution was prepared by diluting a 49 wt % electronics grade HF solution to 11 wt % by deionized $H_2O$. The Piranha-HF treatments were repeated three times.

A fresh Piranha solution was prepared and Sample I was treated at 80° for 10 minutes to form a thin layer of chemical oxide. After treatment, Sample I was rinsed with deionized $H_2O$, and blow-dried with $N_2$. No chemical oxide layer was formed on Sample II.

Sample I was then immediately loaded into an ultrahigh vacuum molecular beam epitaxy (UHV-MBE) chamber having a base pressure of $4\times10^{-10}$ Torr. Sample II was immediately loaded into the UHV-MBE chamber after the third HF treatment that removed the oxide layer. Both of the samples were heated to 620° C. and a Knudsen effusion cell was used to expose the samples to Ge. The effusion cell was operated at 1200° C. for a Ge growth rate of 100 nm/hour. During growth of Ge, the chamber pressure was below $1\times10^{-9}$ Torr.

Cross sectional transmission electron microscopy (XTEM) showed that, in Sample I, amorphous oxide regions were interspersed with Ge seed pads. A single crystalline Ge ELO layer, approximately 4 μm thick, covered the amorphous oxide regions and seed pads. The thickness of the oxide layer regions in Sample I was determined to be 1.2 nm. The average dimension of the seed pads was about 7 nm, and the spacing between the seed pads ranged from 4 nm to 12 nm.

XTEM further showed that the Ge layer of Sample II, having no seed pads, contained a network of dislocation segments primarily within 250 nm from the Ge-Si interface. In contrast, the Ge ELO layer of Sample I was free of a dislocation network. Only stacking faults emanating from the seed pad-Ge interface existed along the {111} planes in the Ge ELO layer of Sample I. Those stacking faults terminated within 80 nm of the interface. As a result, Sample I, fabricated with the oxide layer that resulted in seed pads, formed an atomically abrupt Ge-Si interface and a virtually defect free Ge ELO layer. Sample I had a threading dislocation density of about $1\times10^5$ cm$^{-2}$ or less. Sample II, however, formed without the oxide layer and seed pads, formed a Ge layer containing a network of dislocation segments.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a semiconductor layer comprising:
   forming an oxide layer on a portion of a semiconductor substrate;
   exposing the oxide layer to a material comprising germanium such that a plurality of windows are formed in the oxide layer exposing portions of the semiconductor substrate and such that a plurality of seed pads comprising germanium are formed by self directed touchdown, wherein the plurality of seed pads are formed in the plurality of windows and contact the semiconductor substrate; and
   forming a germanium layer by lateral growth and coalescence of the seed pads such that the germanium layer is disposed over the oxide layer, wherein each of the plurality of windows in the oxide layer is about 2 nm to about 8 nm wide,
   and wherein the germanium layer has a threading dislocation density of less than $1\times10^5$ cm$^{-2}$.

2. The method of forming a semiconductor layer of claim 1, wherein the plurality of seed pads are separated from each other by about 1 nm to 15 nm.

3. The method of forming a semiconductor layer of claim 1, wherein an average seed pad width is about 1 nm to 10 nm.

4. The method of forming a semiconductor layer of claim 1, wherein the oxide layer is about 1 Å to 30 Å thick.

5. The method of forming a semiconductor layer of claim 1, wherein the semiconductor substrate comprises silicon.

6. The method of forming a semiconductor layer of claim 1, further comprising forming a semiconductor layer over the germanium layer.

7. The method of forming a semiconductor layer of claim 1, wherein the step of forming a germanium layer by lateral growth of the seed pads over the oxide layer forms a germanium layer having a thickness greater than 2 nm.

* * * * *